(12) United States Patent
Marsh

(10) Patent No.: US 11,078,071 B2
(45) Date of Patent: Aug. 3, 2021

(54) HAPTIC ACTUATORS FABRICATED BY ROLL-TO-ROLL PROCESSING

(71) Applicant: Encite LLC, Burlington, MA (US)

(72) Inventor: Stephen Alan Marsh, Carlisle, MA (US)

(73) Assignee: Encite LLC, Burlington, MA (US)

( * ) Notice: Subject to any disclaimer, the term of this patent is extended or adjusted under 35 U.S.C. 154(b) by 0 days.

(21) Appl. No.: 16/540,217

(22) Filed: Aug. 14, 2019

(65) Prior Publication Data

US 2020/0123001 A1  Apr. 23, 2020

Related U.S. Application Data

(60) Provisional application No. 62/747,747, filed on Oct. 19, 2018.

(51) Int. Cl.

| | |
|---|---|
| *G01L 9/00* | (2006.01) |
| *H01L 21/00* | (2006.01) |
| *B81B 3/00* | (2006.01) |
| *B81C 1/00* | (2006.01) |
| *H01L 41/113* | (2006.01) |
| *H01L 41/09* | (2006.01) |

(52) U.S. Cl.
CPC ........ *B81B 3/0021* (2013.01); *B81C 1/00158* (2013.01); *H01L 41/0973* (2013.01); *H01L 41/1138* (2013.01); *B81B 2201/032* (2013.01); *B81B 2203/0127* (2013.01); *B81C 2201/019* (2013.01); *B81C 2201/0147* (2013.01)

(58) Field of Classification Search
CPC ...... H01L 41/092–0973; H01L 41/1132–1138; B81C 1/00158

USPC ....................... 438/50–53; 257/254, 418–420
See application file for complete search history.

(56) References Cited

U.S. PATENT DOCUMENTS

| | | | | |
|---|---|---|---|---|
| 3,752,941 A | * | 8/1973 | Massa | G10K 9/122 |
| | | | | 310/324 |
| 5,619,061 A | | 4/1997 | Goldsmith et al. | |
| 6,995,499 B2 | * | 2/2006 | Hwang | G02B 26/0858 |
| | | | | 185/14 |
| 7,042,137 B2 | * | 5/2006 | Yoon | H02N 1/006 |
| | | | | 310/324 |
| 8,564,176 B2 | * | 10/2013 | Nihei | H01L 41/0973 |
| | | | | 310/330 |
| 10,683,200 B2 | * | 6/2020 | Paci | H04N 5/23212 |
| | | | | 310/324 |
| 2002/0149561 A1 | | 10/2002 | Fukumoto et al. | |

(Continued)

*Primary Examiner* — Calvin Lee
(74) *Attorney, Agent, or Firm* — Fish & Richardson P.C.

(57) ABSTRACT

Described is a micro-haptic actuator device that can be fabricated with roll-to-roll MEMS processing techniques. The device includes a first body having a first surface and a second, opposing surface, the body has a chamber defined by at least one interior wall, a piston member disposed in the chamber, physically spaced from the at least one interior wall of the chamber, the piston member having a first surface and a second opposing surface. A membrane layer is disposed over and attached to the first surface of the body, with a portion of the membrane attached to the first surface of the piston member. The device also includes a first electrode supported on a second surface the membrane, and a second body that supports a second electrode, with the second body attached to the second surface of the first body.

20 Claims, 9 Drawing Sheets

(56) References Cited

U.S. PATENT DOCUMENTS

| | | |
|---|---|---|
| 2006/0017533 A1 | 1/2006 | Jahnes et al. |
| 2009/0096326 A1* | 4/2009 | Onishi ................ H04R 17/00 310/334 |
| 2012/0153041 A1 | 7/2012 | Ternoy et al. |
| 2017/0256144 A1 | 9/2017 | Khoshkava et al. |
| 2018/0091905 A1 | 3/2018 | Clerici et al. |

* cited by examiner

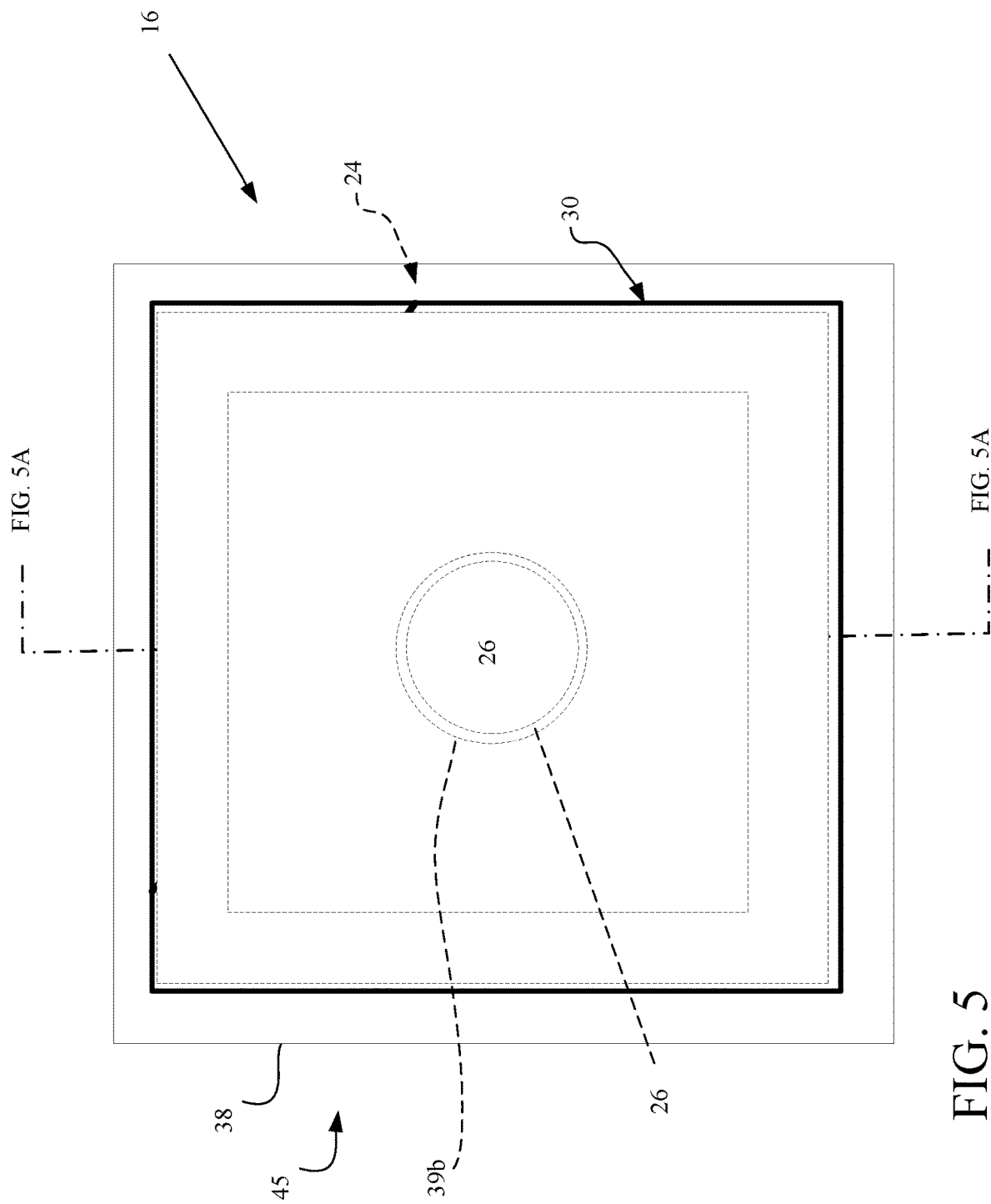

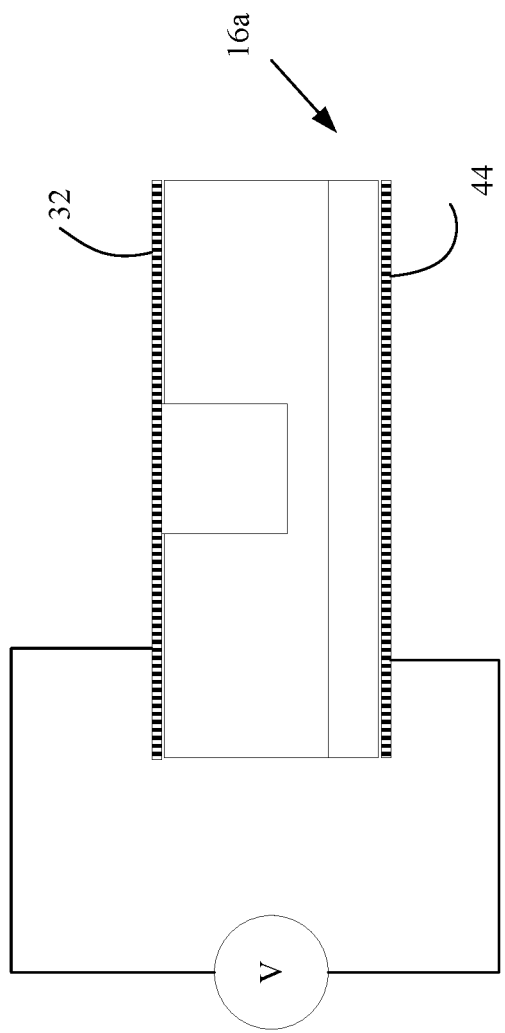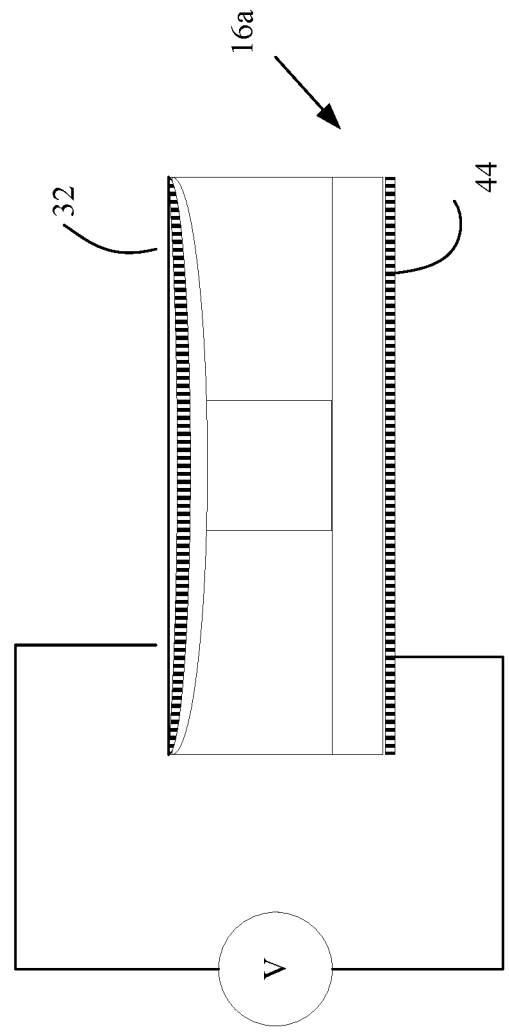

HAPTIC ACTUATORS FABRICATED BY ROLL-TO-ROLL PROCESSING

CLAIM OF PRIORITY

This application claims priority under 35 USC § 119(e) to U.S. Provisional Patent Application Ser. No. 62/747,747, filed on Oct. 19, 2018, and entitled "Haptic Actuators Fabricated by Roll to Roll Processing," the entire contents of which are hereby incorporated by reference.

BACKGROUND

This specification relates to haptic systems and, more specifically, haptic actuators and annunciators and methods of manufacture.

A haptic actuator is a device that produces haptic feedback, e.g., real-time tactile sensations and/or sounds. Haptic actuators are used in a variety of applications, including consumer devices, such as in consumer electronic devices, e.g., smartphones, etc. For example, touch screens are replacing mechanical controls on consumer devices, with a concomitant loss of tactile feedback. For instance, on a keypad, users are more familiar with pushing a mechanical control to indicate a successful entry.

Current technologies for adding haptic feedback include magnetic based haptic actuators, motor based haptics, and piezo-based haptic actuators. Magnetic based haptic actuators typically include a moveable body element and a fixed body element. Movement of the moveable body element is provided by directing magnetic flux between a coil or an electromagnet and/or one or more permanent magnets. The movement causes vibrations that provide a haptic output or feedback. Piezo-based haptic actuators use the piezoelectric properties of certain materials and are often used as multiple piezo units to provide a stronger haptic response and more localized haptic feedback. Piezo actuator applications include vibration stimulation and tactile feedback.

For tactile feedback on consumer portable devices, considerations include the nature of the device, the efficiency of driving, e.g., piezoelectric material in order to minimize battery drain, and the nature of the "feel" of a surface when a human touches the surface and receives haptic feedback. Typically, frequencies around 50 H to a few hundred Hertz provide a suitable tactile response, and can avoid consuming unnecessary power. Slew rates of a few milliseconds provide a sufficiently strong tactile feel, while slew rates much faster than a few milliseconds provide a stronger tactile feel and produce an audible click that can be desirable for some applications but not desirable for other applications.

SUMMARY

Considerations that are involved when selecting haptic technologies for use in certain applications include manufacturing costs and ease of incorporation of various haptic technologies with other devices.

According to an aspect, a device includes a first body layer having a first surface and a second, opposing surface, the first body layer having a chamber defined by at least one interior wall, a piston member disposed in the chamber, the piston member physically spaced from the at least one interior wall of the chamber, the piston member having a first surface and a second opposing surface, a membrane having a first surface and a second surface, the first surface attached to the first surface of the first body layer and attached to the first surface of the piston member, a first electrode supported on the second surface of the membrane, and a second body layer supporting a second electrode, the second body layer affixed to the second surface of the first body layer.

The following are some of the additional features that may be included with the above aspect.

The device is a micro electrostatic haptic actuator and the second body layer is a composite second body layer that includes a first layer having first and second surfaces, with the first surface of the first body layer affixed to the second surface of the second body layer and a second layer affixed to the second surface of the second body layer, with the second electrode disposed on the second layer. The device is a micro electrostatic haptic actuator and the second body layer has a chamber that is terminated by a floor, with the second body layer attached to the first body layer over the second surface of the first body layer, and with the second body layer having the second electrode. The device further includes a first sealing layer over the first electrode and a second sealing layer over the second electrode. The first body layer, the piston member, the membrane, the second body layer and the first and second electrodes comprise a haptic actuator element.

The haptic actuator element is a first haptic actuator element, and the haptic actuator further includes at least one additional haptic actuator element disposed in a stack on the first haptic actuator element. The piston is cylindrical in shape. The device further includes an adhesive layer to affix or attach the membrane to the first body layer. The device further includes an adhesive layer to attach the piston to the membrane. The first body layer has a height in a range of 25 microns to 250 microns.

The device further includes an electronic drive circuit having signal lines coupled to the first and second electrodes. The electronic drive circuit is responsive to an input and is configured to produce a charge differential across the first and second electrodes to cause the piston to strike a portion of the second body layer. The device further includes an electronic drive circuit that is responsive to an input to provide a charge differential across first and second electrodes for causing the second surface of the piston to strike a portion of the second layer. The device further includes an electronic drive circuit, with the electronic drive circuit responsive to an input to provide a charge differential across the first and second electrodes for causing the piston to strike the floor of the chamber.

According to an aspect, a method of fabricating a micro haptic actuator, the method including providing an adhesive layer on a major surface of a first sheet of a flexible material, patterning the adhesive to clear the adhesive from all regions that will correspond a chamber, patterning regions of the first sheet that were cleared of the adhesive to provide piston regions disposed in corresponding chamber regions, with the piston regions having tether elements that tethered pistons to remaining portions of the sheet, affixing with the patterned adhesive layer, a membrane sheet having a first conductive layer to a top portion of the piston regions and remaining portions of the sheet, and adhering a second sheet that supports a second conductive layer to a surface of the first sheet, which opposes the membrane layer.

The following are some of the additional features that may be include with the above aspect.

The adhesive is a type 1801 adhesive and the material of the first and second sheets is polyethylene terephthalate (PET). Patterning the adhesive layer leaves portions of the adhesive on portions of the first sheet corresponding to walls of a body layer and the piston. The second sheet is a composite sheet comprising a spacer layer having a second chamber and a striking layer for the piston. The second sheet is a single sheet having a recess terminating in a floor that provides a striking layer for the piston. The method further includes removing the tether elements.

One or more of the following advantages may be provided by one or more of the above aspects.

The micro-electrostatic haptic actuators described herein may be used for conversion of electrical energy to mechanical, vibratory energy useful in various consumer applications as well as industrial, commercial, medical, and biological applications. As haptic actuators, the devices could be used to produce mechanical vibrations to "announce" an incoming call or to present a confirmatory vibration to a user pressing a touch screen or pad or other control. The haptic actuator devices may produce more complex tactile sensations, as feedback in response to the user touching the touch screen, etc., according to a signal input type. To improve the haptic effects, the haptic actuator can be overdriven with a voltage to reduce the time needed to reach the actuator nominal vibration level.

The haptic actuators can be manufactured using various methods such as MEMS processing techniques and so-called roll-to-roll (R2R) processing. These micro-electrostatic haptic actuators are fabricated on a micron/millimeter scale and more generally, are fabricated by relatively simple and inexpensive techniques. The materials are chosen based on desired properties of the haptic actuator and the method used to manufacture the haptic actuators.

The details of one or more embodiments of the invention are set forth in the accompanying drawings and the description below. Other features, objects, and advantages of the invention are apparent from the description and drawings, and from the claims.

DESCRIPTION OF DRAWINGS

FIG. 5 is a plan view of the electrostatic haptic actuator device.
FIGS. 7A and 7B are views showing the electrostatic haptic actuator connected to a voltage potential in a quiescent state and a driven state, respectively.

DETAILED DESCRIPTION

Micro-Electrostatic Haptic Actuator Overview
Micro-electrostatic haptic actuators described herein are made using micro fabrication methods and can be used for conversion of electrical energy to mechanical, vibratory energy useful in various consumer applications as well as industrial, commercial, medical, and biological applications. Micro-electrostatic haptic actuators are fabricated on a micron/millimeter scale. More generally, the micro-electrostatic haptic actuators discussed below will be used as an example of a device that has a member that moves in a direction that is perpendicular to a surface, e.g., moves up and down in a vertical direction relative to such surface.

Figure 1:
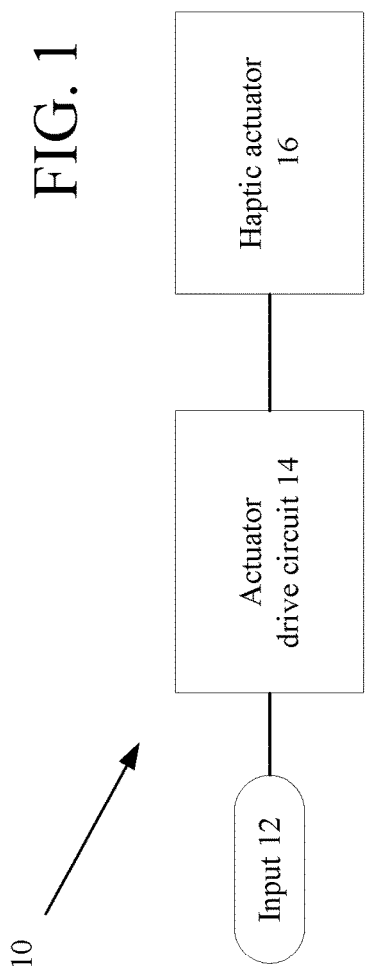
FIG. 1 is a block diagram of a haptic system.

Referring to FIG. 1, a micro-electrostatic haptic actuator system 10 (haptic actuator system 10) is shown. The haptic actuator system 10 has an input 12 that is fed to an actuator drive circuit 14 of the haptic actuator system 10. The input 12 is a signal (input signal) that is used to produce an actuation signal for a micro electrostatic haptic actuator (haptic actuator) 16. While the input signal 12 could originate from a user touching an external device (a tactile input), the input signal can also be a signal that originates at an electrical device (not shown) without user tactile input. In either event, the input signal 12 is fed to the actuator drive circuit 14 that produces a drive signal to drive the haptic actuator device 16. For example, in FIG. 1, the haptic actuator system 10 when driven by an input signal from a device could be used to produce mechanical vibrations to "announce" an incoming call. In another example, in FIG. 1, the haptic actuator system 10 when driven by a tactile input originating from an external device could be used to produce mechanical vibrations as tactile feedback to a user touching the external device.

Figure 2:
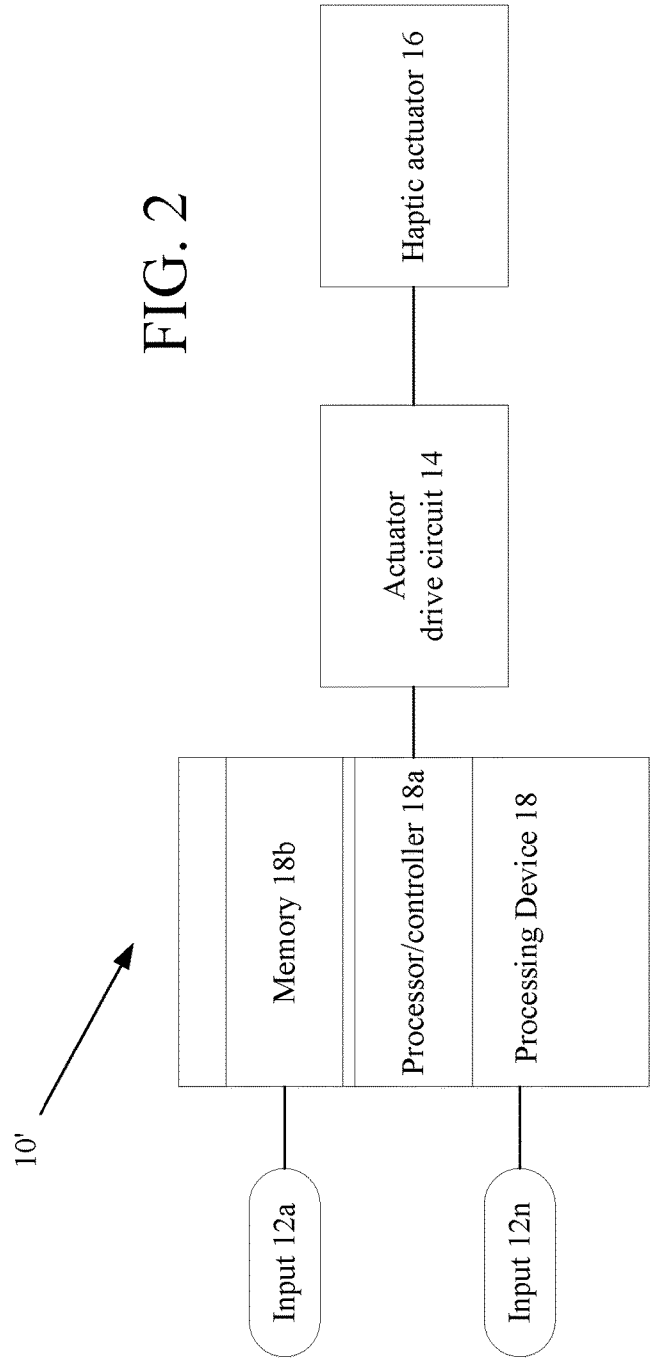
FIG. 2 is a block diagram of an alternative haptic system.

Referring to FIG. 2, an alternative micro-electrostatic haptic actuator system 10' (haptic actuator system 10') is shown. The haptic actuator system 10' has a set of inputs 12 (one or more) that is/are fed to the haptic actuator system 10'. While in FIG. 1, the inputs 12 are signals (input signals) that are used to produce various actuation signals for the haptic actuator device 16, the input signals 12a-12n of FIG. 2 are signals that originate from various sources, such as from a user touching an external device (a tactile input) or can be a signal that originates at an electrical device without user tactile input. The input signals 12a-12n are fed to a processing device 18 that includes a processor or controller 18 and memory 18b. The processing device 18 produces signals according to the type of input received (e.g., which input signal 12a-12n is received) by the processing device 18. These produced signals are fed to the actuator drive circuit 14 that produces drive signals to drive the haptic actuator device 16 and produce a desired haptic output, according to the received input signal 12a-12n.

For example, in FIG. 2, the haptic actuator system 10' could be used to produce mechanical vibrations to "announce" an incoming call. Another input can be a user pressing a touch screen and the haptic actuator system 10' may produce a more complex tactile sensation as feedback in response to the user touching the touch screen, etc. The processor 18 can execute algorithms to automatically produce electrical signals needed to produce certain advanced haptic patterns, e.g., by access to pre-defined haptics libraries. To transmit tactile feedback to the user, the processing device 18 determines the haptic feedback or vibration alerts by identifying inputs to the processing device 18 and executes the appropriate algorithm. Details on how these functions are accomplished are not needed to understand the concepts that will be discussed below. In any event, the signals produced by the processing 18 are fed to the haptic driver 14 to provide a sufficiently high voltage to drive the haptic actuator device 16.

To improve the haptic effects of either system, the haptic actuator device 16 can be overdriven with a voltage to reduce the time needed to reach the actuator nominal vibration level.

Figure 3:
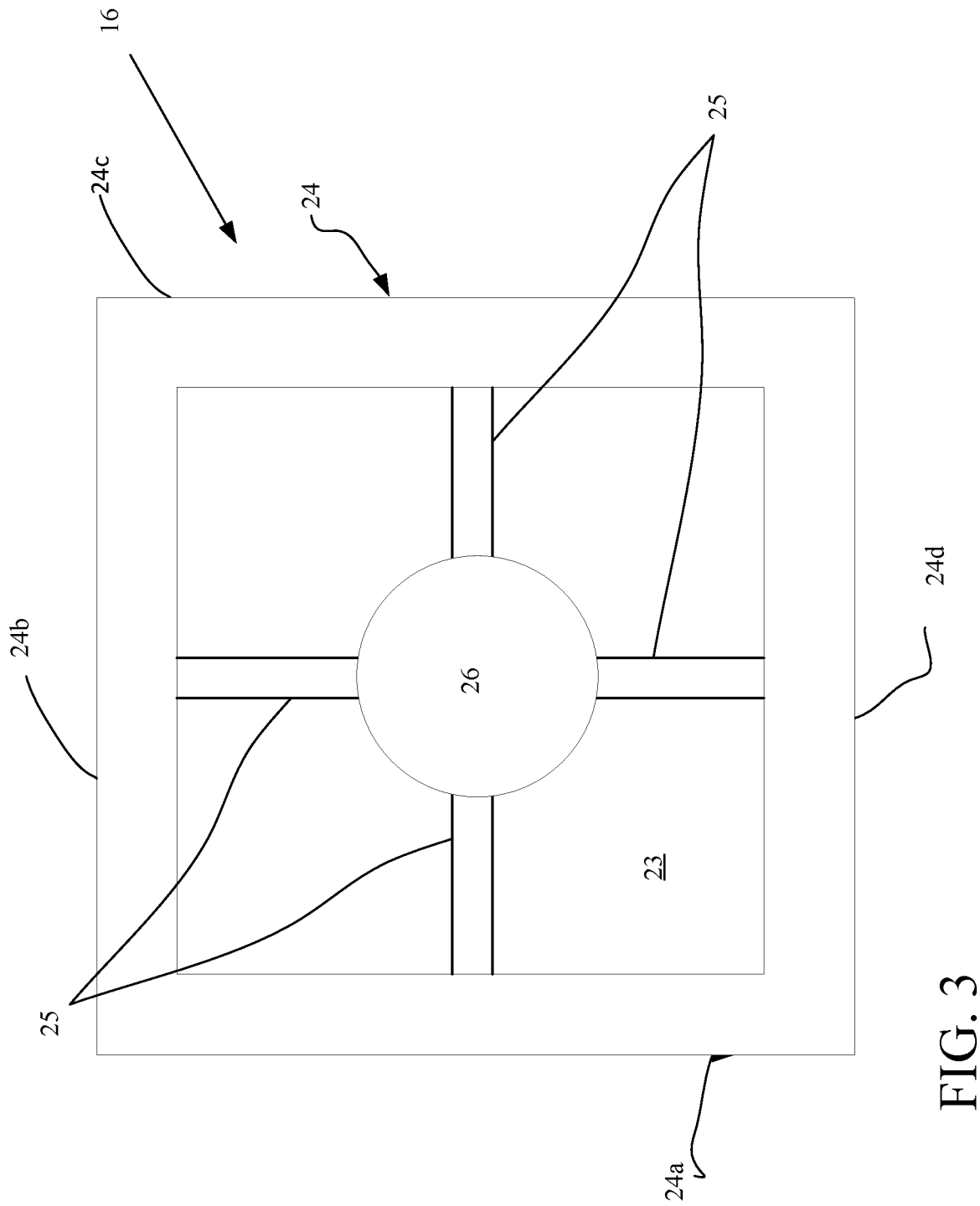
FIG. 3 is a plan view of an electrostatic haptic actuator device in a stage of construction.

Referring now to FIG. 3, the haptic actuator device 16 in a stage of construction, is shown. The haptic actuator device 16 includes a first body 24 provided from a sheet (not shown) of electrically non-conductive material. The first body 24 is shown having plural external walls, e.g., four walls 24a-24d and an interior chamber 23 (as shown the chamber 23 is temporally divided into sub chambers by tethers 25). The interior chamber 23 is shown as defined by walls (not referenced) forming a square shaped chamber. However, the chamber can be of any shape, e.g., defined by a single wall, e.g., a circular chamber, etc. In general the sheet (not shown) is patterned to provide a frame about the chamber.

The sheet (not shown) in addition to being patterned to provide the first body 24, also is patterned to form an interior circular disk portion, e.g., a piston 26 and the tethers 25. The piston 26 is formed from the material used to produce the body layer 24 and is also electrically non-conductive. The piston 26 is tethered (attached) to the first body 24 by the tethers 25 that are patterned portions from the sheet that provided the body layer 24. The tethers 25 support the piston 26 within confines of the first body 24 during subsequent processing (discussed below). In this implementation, the piston 26 is cylindrical and is spaced from the walls 24a-24d by the chamber 23. Other solid shapes could be used.

Figure 4:
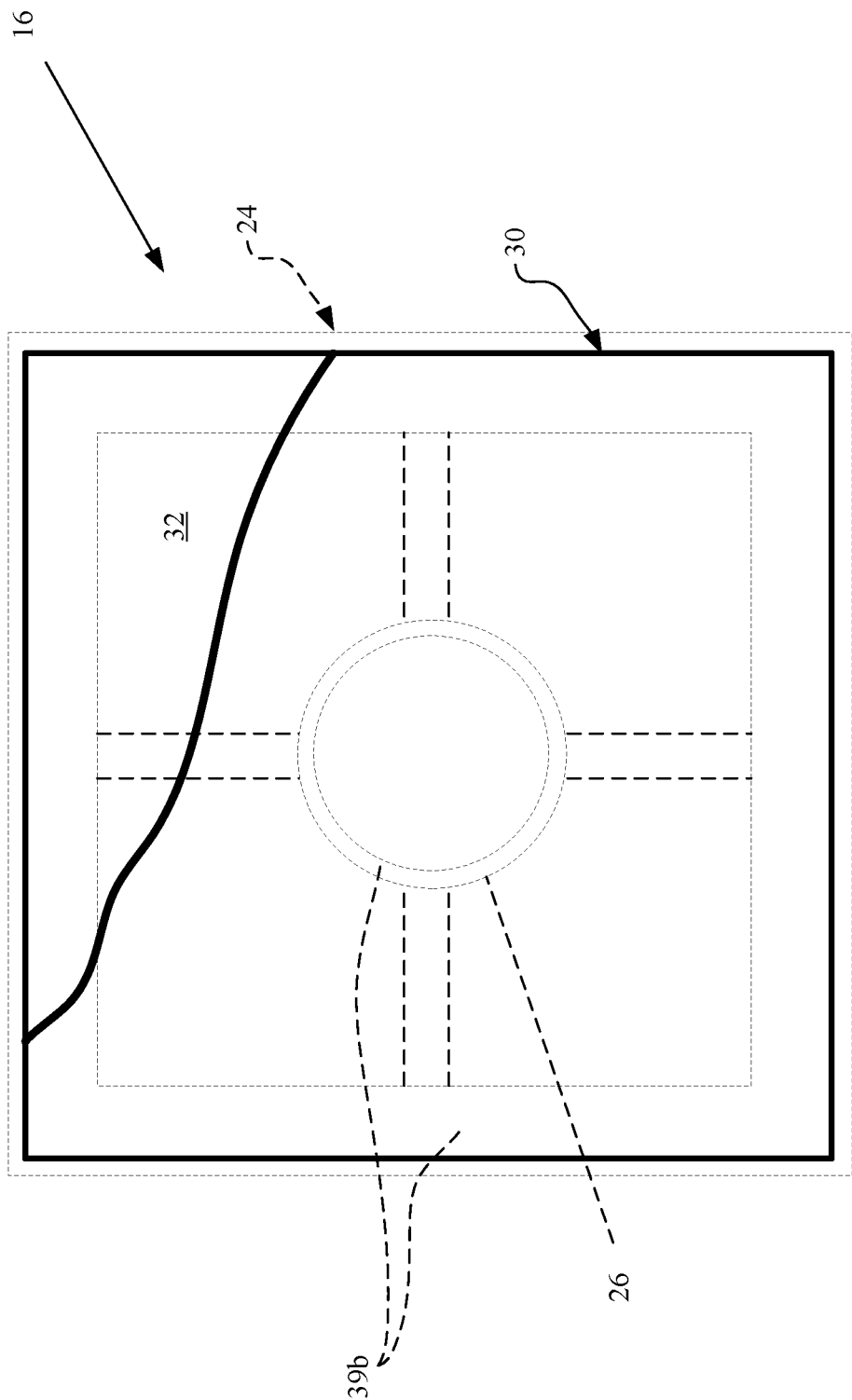
FIG. 4 is a plan view of the electrostatic haptic actuator device in a subsequent stage of construction.

Referring to FIG. 4, the piston 26 is shown (in phantom) still tethered via the tethers 25 (shown in phantom) to the body layer 24. Over first body 24 is provided a membrane layer 30 having a metallized surface 32 (shown partially torn away). The membrane layer 30 is affixed or attached to the walls (not referenced) of the first body 24 and to a top surface of the piston 26. One technique to attach the membrane is by patterning an adhesive layer to provided patterned adhesive layer 39b (shown in phantom). Patterned adhesive layer 39b is shown patterned to have portions on walls of the body layer 24 and the central disk 26. As shown, the portion of the patterned adhesive layer 39b is shown slightly smaller in area than the surface area of the central disk 26, for illustration purposes. In general, the adhesive portion on the central disk 26 could be about the same as or could be slightly smaller or slightly larger in area than the area of the top of the piston 26.

Figures 5A, 5B:
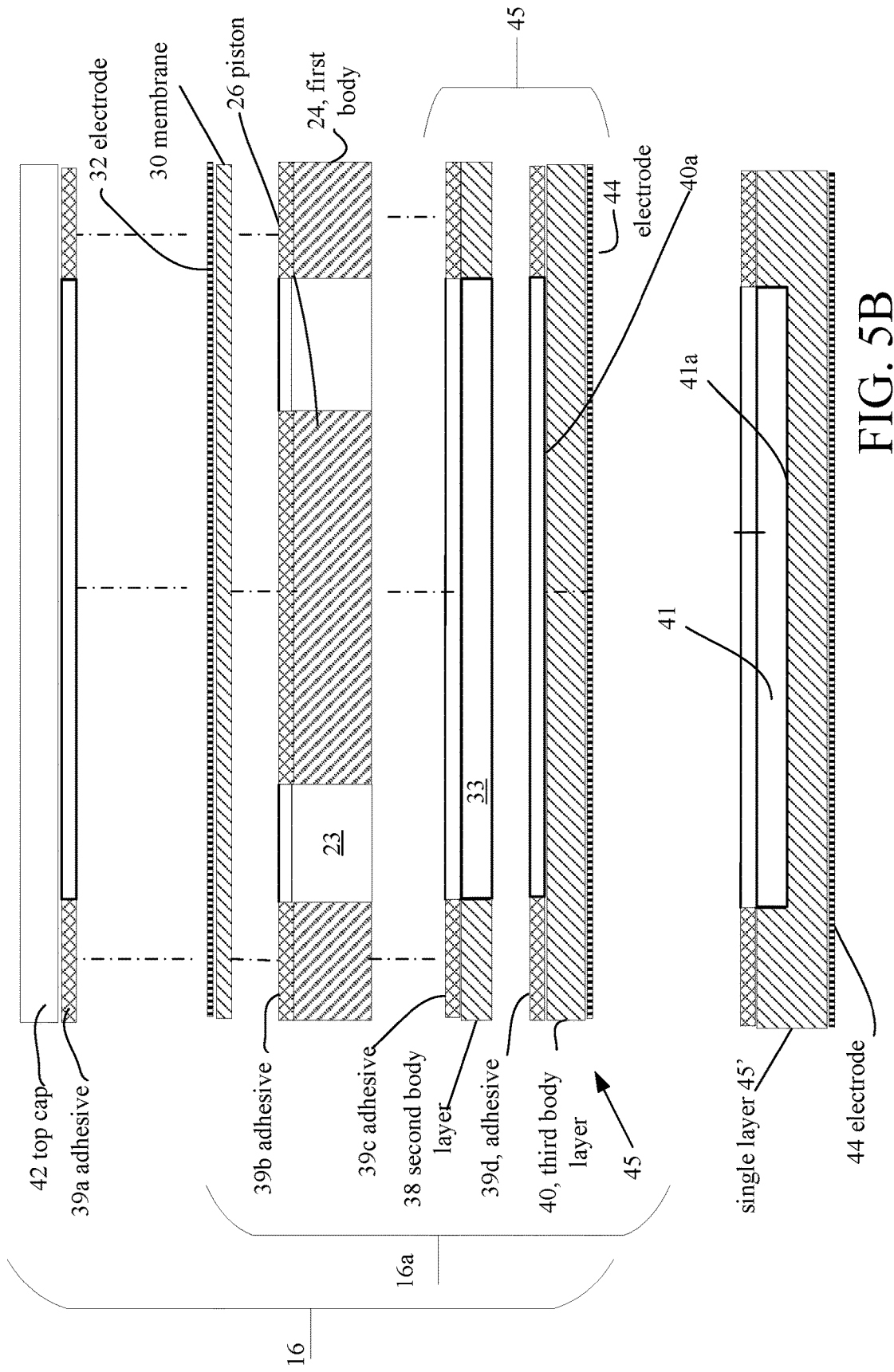
FIG. 5A is an exploded cross-sectional view of FIG. 5.
FIG. 5B is a cross-sectional view showing an alternative bottom layer for the haptic actuator device of FIG. 5.

Referring now to FIG. 5, the haptic actuator device 16 of FIG. 4 is shown with the tethers 25 (FIG. 1) removed leaving the piston 26 attached to the membrane 30 (via the patterned adhesive layer 39b). The haptic actuator device 16 also has a composite layer 45 (FIG. 5A) or (a single layer 45' FIG. 5B) on the bottom of the haptic actuator device 16.

In FIG. 5, the composite layer 45 is provided by a second body layer 38 (shown slightly larger in area than body layer 24, for illustration) on the underside of body layer 24. The second body layer 38 is affixed to the underside of body layer 24, via an adhesive layer that is patterned to provide adhesive region 39c. In general, the second body layer 38 would be about the same as or could be slightly smaller or larger in area than the area of the first body layer 24.

Referring now to FIG. 5A, the first body 24, the second body layer 38, as well as a third body layer 40 and a top cap 42 are affixed by adhesive layers 39a-39d (generally 39), as shown. The top cap 42 is affixed to the membrane 30 on the body layer 24, via an adhesive layer that is patterned to provide patterned adhesive layer 39a. The membrane 30 is affixed to the first body 24 via the patterned adhesive layer 39b. The first body 24 is affixed, via the patterned adhesive layer 39c, to the composite layer 45 that, in this example, is provided by the second body layer 38 and the second body layer 40.

Details of the second body layer 38 on the underside of first body layer 24 are also shown. The second body layer 38 is patterned to provide a frame portion (similar to first body layer 24) about a chamber 33. The chamber 33 in the second body layer 38 provides a space through which the piston 26 travels through. The chamber 23 and the chamber 33 effectively provide a contiguous chamber. The bottom layer 45 of the haptic actuator device 16 also includes the third body layer 40 that carries a second electrode 44. The third body layer 40 has an adhesive layer that is patterned to provide patterned adhesive layer 39d that affixes the third body layer 40 to the underside of the first body layer 38.

The third body layer 40 is a solid layer. The piston 26 travels through the chamber 23 and the chamber 33 in a manner such that a bottom portion of the piston 26 strikes an interior surface 40a of the third body layer 40 and produces a vibration. A bottom cap (not shown) can be provided.

Surface 40a of the third body layer 40 is the surface that is struck by the bottom of the piston 26 (FIG. 5A). Thus, the second electrode 44 would typically be at an outer portion (bottom) of the third body layer 40. However, in some implementations, the second electrode 44 could be on surface 41a, e.g., within the chamber 33, e.g., on the floor of the chamber 33.

Referring momentarily to FIG. 5B, in some implementations, an alternative single layer 45' can be used at the bottom of the haptic actuator device 16. The alternative single layer 45' effectively merges the layers 38 and 40 (FIG. 5A). The alternative single layer 45' has a frame portion surrounding a recess 41 that has a solid bottom portion. The frame portion (not referenced) surrounds the recess 41 that is provided as a hollowed out region in the single layer 45'. The bottom portion of the single layer 45' carries the electrode 44, as shown in FIG. 5B. A bottom interior surface 41a of the recess 41 is the surface that is struck by the bottom of the piston 26 (FIG. 5A). Thus, the second electrode 44 would typically be at an outer portion (bottom) of the single layer 45'. However, in some implementations, the second electrode 44 could be on surface 41a, e.g., within the chamber 41, e.g., on the floor of the chamber 41.

The piston 26 is affixed at one end to the membrane 30. As the membrane 30 flexes (as discussed below) the piston 26 moves in a direction that is perpendicular to a nominal position of the membrane 30 striking a surface, e.g., body layer 40 (FIG. 5A) or bottom surface 41a of the recess 41 in layer 38' (FIG. 5B) and thus moves up and down in a vertical direction relative to such surfaces.

In FIG. 5A, a minimum repeatable configuration 16a is indicated as layers 24 and 45, with corresponding membrane 30, electrodes 32, 44, piston 26, and adhesive layers generally 39. (In FIG. 5B, a minimum repeatable configuration (not referenced) would be layers 24 and 45', with corresponding membrane 30, electrodes 32, 44, piston 26 and adhesive layers generally 39.)

Figure 5C:
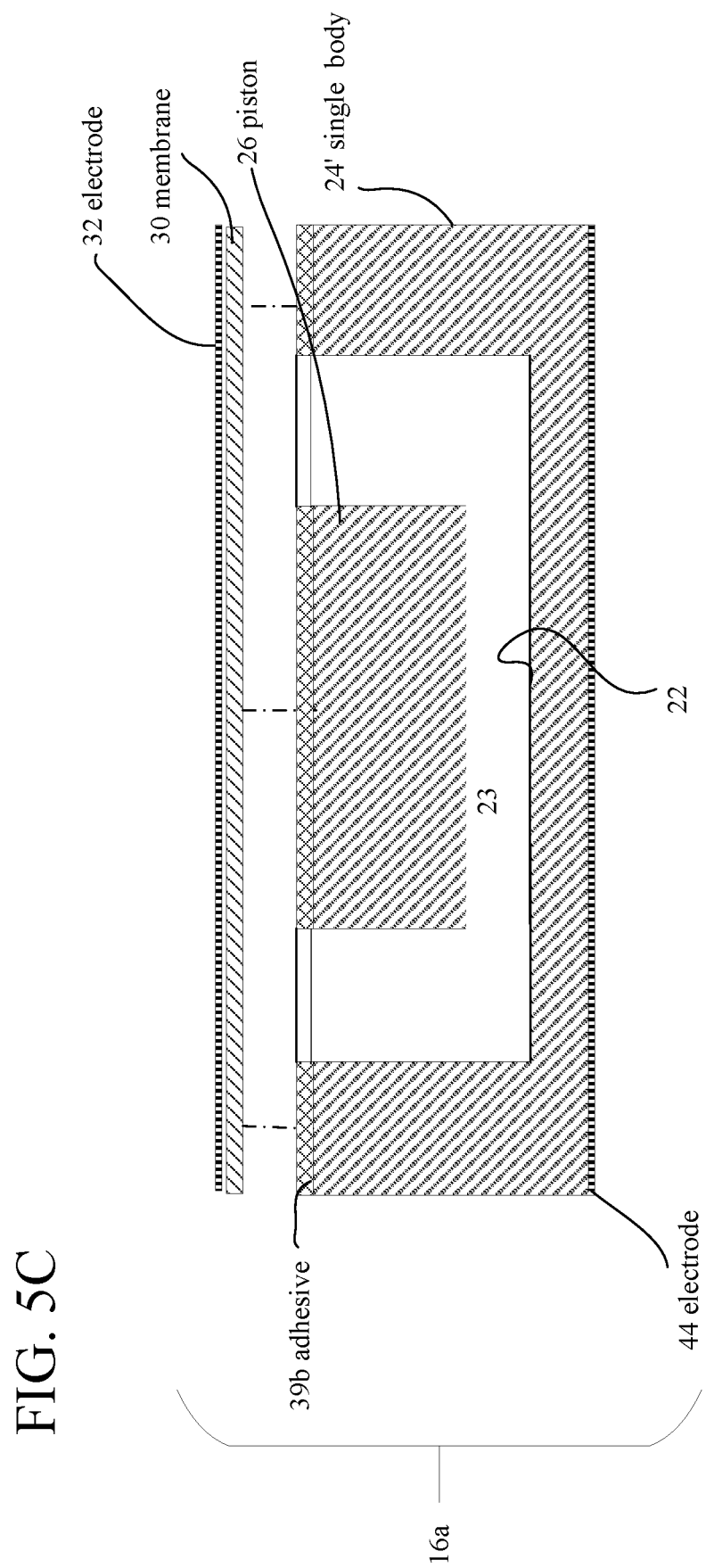
FIG. 5C is a cross-sectional view showing a minimal configuration for a haptic actuator device.

Referring now to FIG. 5C, an alternative minimum repeatable configuration 16b for the haptic actuator device 16 is shown as a single body 24' having the chamber 23 and a floor 22 that is struck by the piston 26 attached to the membrane 30. The electrode 32 is carried by the membrane 30 and the electrode 44 is on an outer surface of the first body 24'. Thus, while it is feasible for the haptic actuator device 16 to have a single first body 24', for practical manufacturing considerations, the first body 24 is augmented by a set of body layers, e.g., body layers 38 and 40 that comprise the composite body layer 45, as shown in FIG. 5A or a single bottom layer 45' as shown in FIG. 5B.

Actuator Drive

Referring also back to FIG. 1 and/or FIG. 2, the actuator drive 14 for applying voltage signals receives an input signal input 12 and outputs a drive voltage to electrodes 32, 44 (FIG. 5A) of the haptic actuator device 16. The actuator drive 14 includes a high voltage multiplier circuit (not shown). The high voltage multiplier circuit multiplies a supply voltage up to a desired high voltage value, e.g., about 100V to 700V, nominally, 500 V or more. Other voltages depending on material characteristics, such as dielectric constants, thicknesses, mechanical modulus characteristics, electrode spacing, etc. can be used.

Suffice it to say that the applied voltage level would be between the minimal voltage needed to guarantee movement of the piston 26 to strike the bottom body layer 40 under conditions specified and the maximum voltage being the voltage that would cause deleterious effects on the materials of the haptic actuator device 16. Therefore, other voltage ranges would be within the scope of this teaching and such voltage ranges would be predicated on the specific dielectric properties of the materials that were used to construct the body layers, specifications for the haptic actuator device 16, etc.

Figure 6:
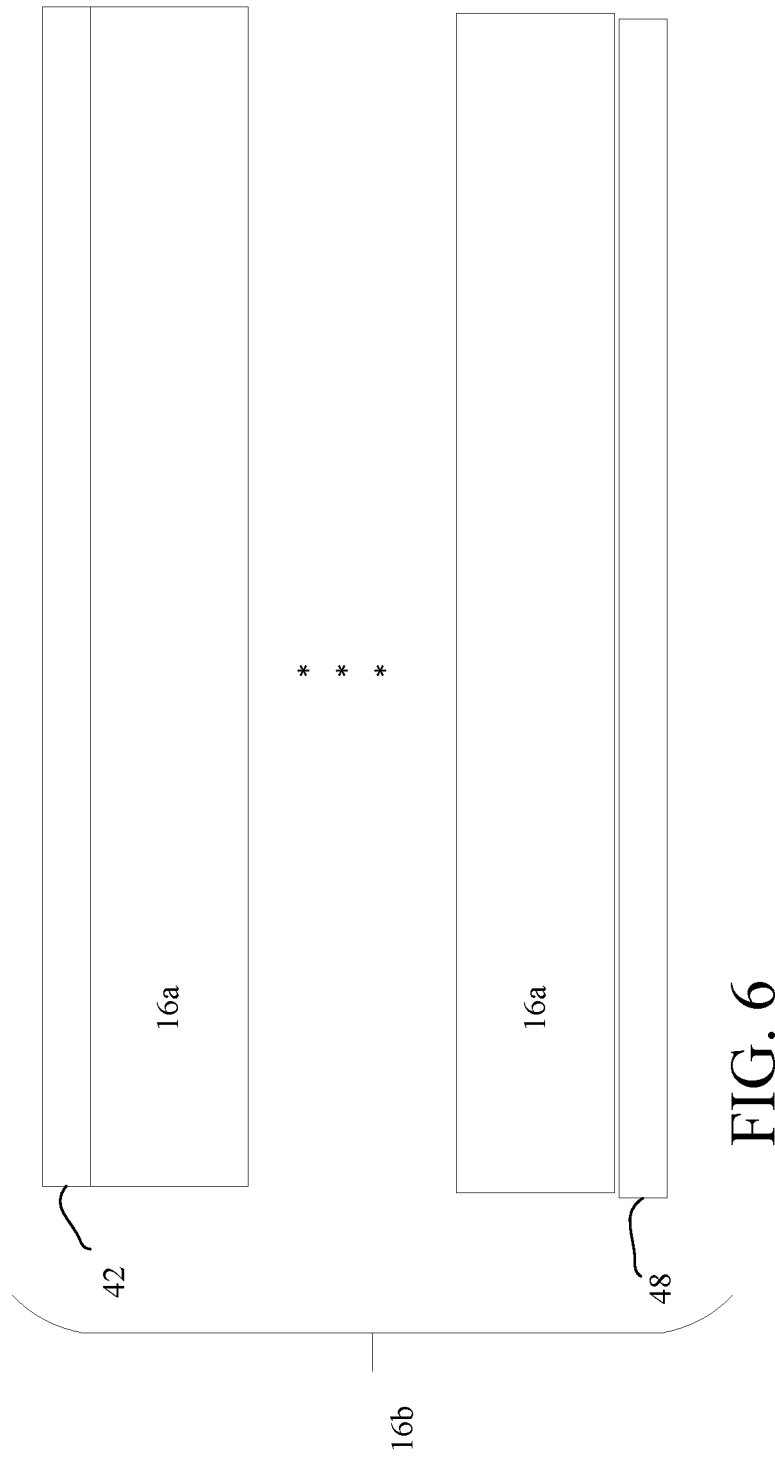
FIG. 6 is a exploded view showing stacked electrostatic haptic actuator devices that provide a composite electrostatic haptic actuator device.

Referring now to FIG. 6, a stacked haptic actuator device 16b is shown. The stacked haptic actuator device 16b comprises a plurality of minimum repeatable configuration elements 16a, such as any of the minimum repeatable configuration elements described in FIGS. 5A-5C. In some implementations, the stacked haptic actuator device 16b would produce vibrations at higher amplitudes than a single one of the minimum repeatable configuration elements 16a (FIG. 5A). The stacked haptic actuator device 16b also includes a top cap 42 (FIG. 5A) on a top one of the minimum repeatable configuration elements 16a and a bottom cap 48 (that could be a last one of the bottom layers) on a bottom one of the minimum repeatable configuration elements 16a.

Operational Principles

Referring now to FIGS. 7A and 7B, the haptic actuator device 16 (minimum repeatable element 16a shown) has the electrodes 32 and 44 connected to a voltage source V (representation of the actuator drive 14 FIGS. 1, 2). Between the electrodes 32 and 44 are layers that have dielectric properties (dielectric properties of the material of the body layers 24, 38 and 44, adhesive layers 39b-39d and air). In the presence of a potential difference between the electrodes 32, 44 charges of opposite polarities are built up on the electrodes 32, 44. This charge build up at some point causes the electrode 32 on the membrane 30 to be attracted to and thus flex the membrane 30 towards the electrode 44 and in turn causing the piston 26 to strike the bottom of the device 16 (e.g., surfaces 40a or 41a).

More specifically, operation can be explained as follows: Consider a voltage is applied between the electrodes 32 and 44, e.g., positive charge on the electrode 32, and, e.g., a negative charge on the electrode 44. With electrode 32 having a positive charge and electrode 44 having a negative charge (relative to the charge on 32), this occurrence will cause the membrane 30 to be attracted to electrode 44 due to attraction of opposite charges and because the membrane 30 is flexible relative to the body layers 24, 38 and 40. Concomitant with the attraction of the membrane 30 to the electrode 44, the piston 26 will also be attracted to the body layer 40. With application of a sufficiently high voltage, at a high slew rate (rate of change in charge buildup), the piston 26 will be attracted with a "striking motion" to strike the bottom surface 40a of the body layer 40 producing a vibration or sound. Removal of the voltage will cause the membrane 30 to retract to its nominal position.

The voltage applied is nominally 500 V but can range up to 700 V to 1000 V or more. Furthermore, based on the phenomenon of pull-in and drop-out voltages, the drive voltage can be reduced to a lower voltage once the highest magnitude of the voltage is reached. In general, the "pull in" voltage is the voltage required for the membrane 30 to travel approximately ⅔'s of the distance between the bottom of the piston 26 and top of the body layer 40. Once that distance is achieved, the travel to the striking portion at the bottom of the body layer occurs very rapidly with a concomitant strong vibration. Additional mass could be provided to the piston 26 such as by fabricating the piston from a higher density material than the body layer. Due to the electrostatic nature of the haptic actuator device 16, current levels are extremely low or nil.

Manufacturing

The haptic actuator device 16 having the above-described features can be manufactured using various methods such as MEMS processing techniques and so-called roll-to-roll (R2R) processing. The materials for the haptic actuator device 16 are chosen based on desired properties of the haptic actuator device 16 and the method used to manufacture the haptic actuator device 16. Below are some criteria for choosing the materials of the different parts of the haptic actuator device 16.

Electrostatic haptic actuator body—The material used for the body layer 24, as well as body layers 38 and 40 (or the merged first body layer 38') is defined by various requirements. In general, the material needs to be strong or stiff enough to hold its shape to produce a chamber. In some implementations, the material is etchable or photo sensitive so that features, e.g., the piston 26 and chamber 23, etc., can be defined and machined/developed. It is also desirable that the material interacts well, e.g., adheres, with/to the other materials in the haptic actuator device 16. Furthermore, the material is electrically non-conductive. Examples of suitable materials include SU8 (negative epoxy resist), and PMMA (Polymethyl methacrylate) resist.

Membranes—The material for this part is an elastic material that carries a conductive layer from which the electrode is provided. As such, the material is elastic and bends or stretches back and forth. The membrane material can be impermeable to fluids of interest, is electrically non-conductive, and has a relatively high breakdown voltage characteristic. Examples of suitable materials include silicon nitride, and Teflon. Others materials that are stiff are also possible.

Electrodes—The material of the electrodes is electrically conductive. Because the electrodes do not conduct significant amounts of current, the material can have a high electrical sheet resistance, although the high resistance feature is not necessarily desirable. The electrodes are subject to bending and stretching with the membranes, and therefore, it is desirable that the material is supple to handle the bending and stretching without fatigue and failure. In addition, the electrode material and the membrane materials adhere well, e.g., do not delaminate from each other under the conditions of operation. Examples of suitable materials include very thin layers of gold and platinum. Others are possible.

Electrical interconnects—The voltages from the capacitance measurement circuits are conducted to the electrode on each membrane. Electrically conducting paths to these electrodes can be built using conductive materials, e.g., gold and platinum. In some portions of the electrical interconnects conductive inks could be used.

Other materials—when MEMS processing is used in manufacturing the micro electrostatic haptic actuator device 16, a sacrificial filling material, e.g., polyvinyl alcohol (PVA), can be used. The sacrificial filling material may also be used in R2R processing. In some implementations, solvents are used in the manufacturing process, which may place additional requirements on the various building materials of the haptic actuator device 16. It may be possible to print some of the electrical circuit components onto the membranes. In general, while certain materials have been specified above, other materials having similar properties to those mentioned could be used.

End plates (not shown in the figures) can be placed above and below the finished haptic actuator device 16 to protect the electrodes and membranes, etc. from an ambient. The finished haptic actuator device 16 can be packaged in various types of packages such as those used for integrated circuits.

As mentioned above, while several approaches can be used to fabricate the haptic actuator device 16, such as MEMS processing (Microelectromechanical systems) techniques discussed below will be techniques for fabrication by roll-to-roll processing that can also be applied to formation of other types of devices/systems.

Roll-to-Roll Processing for Producing the Electrostatic Haptic Actuator

A roll-to-roll processing line can comprises several stations that can be or include enclosed chambers at which deposition, patterning, and other processing occurs. Processing viewed at a high level thus can be additive (adding material exactly where wanted) or subtractive (removing material in places where not wanted). Deposition processing includes evaporation, sputtering, and/or chemical vapor deposition (CVD), as needed, as well as printing. The patterning processing can include depending on requirements techniques such as scanning laser and electron beam pattern generation, machining, optical lithography, gravure and flexographic (offset) printing depending on resolution of features being patterned. Ink jet printing and screen printing can be used to put down functional materials such as conductors. Other techniques such as punching, imprinting and embossing can be used.

The original raw material roll is of a web of flexible material. In roll-to-roll processing the web of flexible material can be any such material and is typically glass or a plastic or a stainless steel. While any of these materials (or others) could be used, plastic has the advantage of lower cost considerations over glass and stainless steel. Specific materials will be determined according to the application of the haptic actuator device 16. In applications, materials such as stainless steel or other materials that can withstand encountered temperatures would be used, such as Teflon and other plastics that can withstand encountered temperatures. With stainless steel, however, there would be considerations of dielectrics need to ensure electrical isolation among the various elements.

For the structure shown, stations within a roll-to-roll processing line are set up according to the processing required. Thus, while end caps (bottom and top and side caps) could be formed on the web or plastic sheet in one implementation the end caps are provided after formation of the micro electrostatic haptic actuator device 16 stack, as will be described.

The body layers 24, 38 and 40, and membrane 30 can have the same planar dimensions with the membrane 30 being about 10% of the thickness of the body layers. The electrodes 32 and 44 can have smaller dimensions and a thickness of 0.02% of that of the body layers. In some implementations, the body layers have planar dimensions of about microns by microns to about millimeters by millimeters, and a thickness of about 50 microns to 250 microns. The body layers have an inner dimension of the chambers 23 of about microns by microns to about millimeters by millimeters leaving a frame of sufficient size to attach to the membranes and subsequent layers. The electrodes 30, 44 have dimensions that substantially correspond to inner dimensions of the body layers. A typical surface area for the electrodes is about 2.25 mm$^2$ and a thickness of about 0.1 microns. These dimensions are merely exemplary.

Figure 8:
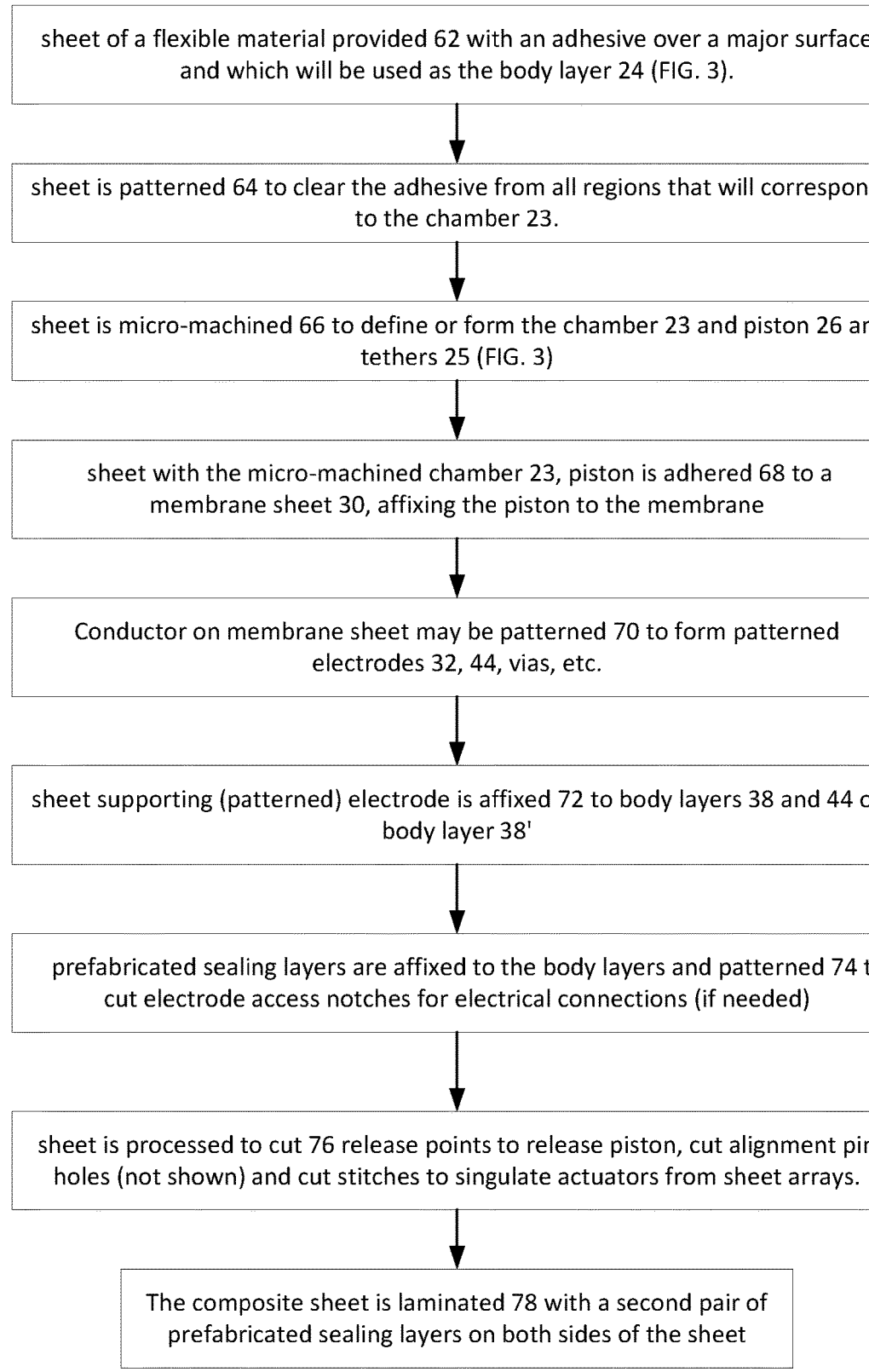
FIG. 8 is flow diagram of roll-to-roll processing for producing the electrostatic haptic actuator.

Referring now to FIG. 8, a flow diagram that depicts roll-to-roll processing 60 to provide the haptic actuator device 16 is shown. A sheet of a flexible material (not shown) such a non-metalized 50 micron thick sheet is provided 62 with a double sided adhesive over a major surface and which will be used as the first body 24 (FIG. 3). The adhesive is a type 1801. For the particular implementation of the haptic actuator device 16, the material is polyethylene terephthalate (PET). Other materials could be used.

The sheet with the adhesive is patterned 64 to clear the adhesive from all regions that will correspond to the chamber 23. Thus, for example, portions of the sheet corresponding to the walls of the first body 24 and the piston 26 will have regions of adhesive, but the portions corresponding to the chamber 23 will not have adhesive. A mask (not shown) is used to configure a laser ablation station to pattern the adhesive on the sheet.

The sheet is micro-machined 66 using another mask (not shown) or direct write to configure a laser ablation station to define or form the chamber 23 and the piston 26 with tethers 25, as discussed in FIG. 3. Vias (not shown) can also be provided for electrical connections. The micro-machining ablates away the plastic to form the chamber 23 and the piston 26 from the first body 24 (FIG. 3).

The sheet with the micro-machined chamber 23 and piston 26 is adhered 68 to a membrane sheet 30' (FIG. 4), e.g., a 5 micron thick sheet of PET with a metallic layer 32 (FIG. 4) of Al of 100 A thickness. The sheet with the micro-machined chamber 23 and piston 26 is affixed to the membrane sheet 30' by the adhesive, with the metallic electrode layer 32 of the sheet facing outwards from the body layer 24. Once affixed by the adhesive layer, the piston 26 remains attached to the membrane 30.

The conductive layer 32 on the membrane sheet 30' may be patterned 70 to form conductors (not shown) to connect to the electrode 32 layer on the membrane sheet 30'. The membrane sheet 30' may be machined to provide alignment holes (not shown). Tethers 25 could be removed at this stage of processing, e.g., by patterning from the backside of the body layer 24.

The membrane sheet 30' supporting the electrode 32 is laminated 72 to the body layers 38 and 40 that can be prefabricated. The second body layer 38 is disposed on the first body 24 at a surface of the first body 24 that opposes the membrane layer 30. The second body layer 38 is patterned to provide a central chamber 23 surrounded by walls. Body layer 40 is disposed on the body layer 38. Body layer 40 is a solid layer without a chamber 23 that is used as a striking surface for the piston 26 (FIG. 5). The body layers 38 and 40 are 25 to 50 micron sheets having a 1801 type adhesive.

A pair of prefabricated sealing layers (sealing layers being 50 micron sheets having 1801 adhesive) can be provided over the body layer 40 and membrane 32 and can be patterned to cut 76 electrode access notches for electrical connections, release points to release moving parts such as the tethers (if not previously removed), notches such as for piston cut alignment pin holes (not shown) that are used to position the haptic actuator device 16 in a fixture, if needed, (e.g., for stacking), and cut stitches that are used to singulate haptic actuators 16 from sheet arrays. Optionally, the composite sheet is laminated 78 with a second pair of prefabricated sealing layers on both sides of the sheet.

The above technique can also use a machine vision system producing a data file that is used by the laser ablation system in aligning a laser ablation station with a mask (or direct write) such that a laser beam from the laser ablation system provides features according to the mask used in registration with the corresponding portions of the bodies, as discussed. The electrodes are formed by ablating away the metal in regions that are not part of the electrodes and conductors, leaving isolated electrodes and conductors on the sheet.

A jig or test fixture (not shown) can be used in conjunction with the alignment pin holes for stacking of repeatable layers of the piston and strike surface. Other stacking techniques besides a jig for assembly are possible with or without the alignment pin holes.

Via conductors to interconnect the patterned electrodes on stacked haptic actuators 16 are castellated conductive structures, i.e., with relatively wide areas contacting electrode tabs (not shown) and relatively narrow areas positioned through holes in the electrodes. This arrangement is provided by having the holes in the body portions larger than the holes through the electrode portions. This can be accomplished during the patterning stages of the body and the electrodes respectively. The via conductors are formed by introduction of the conductive inks mentioned above into the holes.

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

Other embodiments are within the scope of the following claims. For example, other techniques to adhere (i.e., affix) layers together could be used such as laser welding, etc.

What is claimed is:

1. A method of fabricating a micro haptic actuator, the method comprises:
    providing an adhesive layer on a major surface of a first sheet of a flexible material;
    patterning the adhesive to clear the adhesive from all regions that will correspond to a chamber;
    patterning a region of the first sheet that was cleared of the adhesive layer to provide the chamber having interior walls and a piston member disposed in the chamber, with the piston member having tether elements that tethered the piston member to at least one of the interior walls of the sheet;
    affixing the patterned adhesive layer to a membrane sheet having a first electrode with the membrane sheet affixed to a top portion of the piston member and remaining portions of the sheet affixed to the patterned adhesive layer; and
    adhering a second sheet that supports a second electrode to a surface of the first sheet, which opposes the membrane sheet layer.

2. The method of claim 1 wherein patterning the adhesive layer leaves portions of the adhesive on portions of the first sheet corresponding to walls of a body layer and the piston member.

3. The method of claim 1 wherein the second sheet is a composite sheet comprising a spacer layer having a second chamber and a striking layer for the piston member.

4. The method of claim 1 wherein the adhesive is a type 1801 adhesive and the material of the first and second sheets is polyethylene terephthalate (PET).

5. The method of claim 1 wherein the second sheet is a single sheet having a recess terminating in a floor that provides a striking layer for the piston member.

6. The method of claim 1 further comprising:
    removing the tether elements.

7. A device comprises:
    a first body layer having a first surface and a second, opposing surface, with the first body layer having a chamber defined by at least one interior wall in the first body layer;
    a piston member disposed in the chamber, the piston member physically spaced from the at least one interior wall of the chamber, with the piston member having a first surface and a second opposing surface;
    a membrane having a first surface and a second surface, with the first surface attached to the first surface of the first body layer and attached to the first surface of the piston member;
    a first electrode supported on the second surface the membrane; and
    a second body layer supporting a second electrode, the second body layer attached to the second surface of the first body layer.

8. The device of claim 7 further comprising:
    a first sealing layer over the first electrode and a second sealing layer over the second electrode.

9. The device of claim 7, further comprising:
    an adhesive layer to attach the membrane to the first body layer.

10. The device of claim 7, further comprising:
    an adhesive layer to attach the piston to the membrane.

11. The device of claim 7 wherein the first body layer has a height in a range of 25 microns to 250 microns.

12. The device of claim 7 wherein the piston is cylindrical in shape.

13. The device of claim 7 wherein the device is a micro electrostatic haptic actuator and the second body layer is a composite second body layer that includes:
    a first layer having an aperture that forms a part of the chamber and further having first and second surfaces, with the first surface of the first layer affixed to the second surface of the first body layer; and
    a second layer having a striking surface and further having first and second surfaces, with the first surface attached to the second surface of the first layer, with the second electrode disposed on the second surface of the second layer.

14. The device of claim 13 further comprising:
    an electronic drive circuit that is responsive to an input to provide a charge differential across first and second electrodes for causing the second surface of the piston to strike a portion of the second layer.

15. The device of claim 7 wherein the device is a micro electrostatic haptic actuator, the chamber is a first chamber and the second body layer has a second chamber that is terminated by a floor, with the second body layer attached to the first body layer over the second surface of the first body layer, and with the second body layer having the second electrode.

16. The device of claim 15 further comprising:
an electronic drive circuit;
with the electronic drive circuit responsive to an input to provide a charge differential across the first and second electrodes for causing the piston to strike the floor of the chamber.

17. The device of claim 7 wherein the first body layer, the piston member, the membrane, the second body layer and the first and second electrodes comprise a haptic actuator element.

18. The device of claim 17 wherein the haptic actuator element is a first haptic actuator element, and the haptic actuator further comprises:
at least one addition haptic actuator element disposed in a stack on the first haptic actuator element.

19. The device of claim 7 further comprising:
an electronic drive circuit having signal lines coupled to the first and second electrodes.

20. The device of claim 19 wherein the electronic drive circuit is responsive to an input and is configured to produce a charge differential across the first and second electrodes to cause the piston to strike a portion of the second body layer.

* * * * *